(12) United States Patent
Im et al.

(10) Patent No.: US 8,531,887 B2
(45) Date of Patent: Sep. 10, 2013

(54) NONVOLATILE MEMORY DEVICE AND RELATED PROGRAMMING METHOD

(75) Inventors: Jung-no Im, Gunpo-si (KR); Jae-woo Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 71 days.

(21) Appl. No.: 13/342,312

(22) Filed: Jan. 3, 2012

(65) Prior Publication Data

US 2012/0170374 A1 Jul. 5, 2012

(30) Foreign Application Priority Data

Jan. 4, 2011 (KR) ........................ 10-2011-0000554

(51) Int. Cl.
 *G11C 16/04* (2006.01)
(52) U.S. Cl.
 USPC ............ 365/185.19; 365/185.21; 365/185.22; 365/185.18

(58) Field of Classification Search
 USPC ............ 365/185.19, 185.21, 185.22, 185.18, 365/185.24
 See application file for complete search history.

(56) References Cited

U.S. PATENT DOCUMENTS

| 7,307,887 | B2 | 12/2007 | Chen |
| 8,116,140 | B2* | 2/2012 | Dong et al. ............... 365/185.19 |
| 2006/0291290 | A1 | 12/2006 | Kim et al. |

FOREIGN PATENT DOCUMENTS

| JP | 2000-123581 | 4/2000 |
| KR | 1020070000525 A | 1/2007 |

* cited by examiner

*Primary Examiner* — David Lam
(74) *Attorney, Agent, or Firm* — Volentine & Whitt, PLLC

(57) ABSTRACT

A nonvolatile memory device programs a memory cell by performing a plurality of program loops each comprising a program operation and a program verifying operation. Where the program verifying operation in one program loop determines that the memory cell has been successfully programmed to a target state, a soft-programming operation is performed in a subsequent program loop to determine whether the memory cell has retained the target state, and if not, increases the threshold voltage of the memory cell.

20 Claims, 15 Drawing Sheets

FIG. 3

| LOOP OPERATION | PROGRAM/POSITION OF MEMORY CELL AFTER INHIBITING | | WHETHER TO PROGRAM OR INHIBIT IN NEXT LOOP OPERATION AFTER VERIFYING OPERATION | |
|---|---|---|---|---|
| | FIRST MEMORY CELL (①) | SECOND MEMORY CELL (②) | FIRST MEMORY CELL (①) | SECOND MEMORY CELL (②) |
| 1 st | A | A | Program | Program |
| 2 nd | A | B | Program | Inhibit (temporary) |
| n th | B | A | Inhibit (temporary) | BL Forcing Program |
| 4 th | B | A | Inhibit (temporary) | BL Forcing Program |
| 5 th | B | B | Inhibit (temporary) | Inhibit (temporary) |
| 2n th | B | B | Inhibit | Inhibit |

FIG. 10

| LOOP OPERATION | PROGRAM/POSITION OF MEMORY CELL AFTER INHIBITING | | WHETHER TO PROGRAM OR INHIBIT IN NEXT LOOP OPERATION AFTER VERIFYING OPERATION | |
|---|---|---|---|---|
| | FIRST MEMORY CELL (①) | SECOND MEMORY CELL (②) | FIRST MEMORY CELL (①) | SECOND MEMORY CELL (②) |
| 1 st | A | A | Program | Program |
| 2 nd | A | B | Program | Inhibit (temporary) |
| n th | A | A | Program | BL Forcing Program |
| 4 th | B | A | Inhibit (temporary) | BL Forcing Program |
| 5 th | A | B | Inhibit (temporary) | Inhibit (temporary) |
| 2n th | A | B | BL Forcing Program | Inhibit |
| 7 th | B | B | Inhibit (temporary) | Inhibit |

FIRST LOOP OPERATION

SECOND LOOP OPERATION $n^{th}$ LOOP OPERATION (n=3)

FOURTH LOOP OPERATION

NONVOLATILE MEMORY DEVICE AND RELATED PROGRAMMING METHOD

CROSS-REFERENCE TO RELATED APPLICATIONS

This application claims priority under 35 U.S.C. §119 to Korean Patent Application No. 10-2011-0000554, filed on Jan. 4, 2011, the disclosure of which is hereby incorporated by reference in its entirety.

BACKGROUND OF THE INVENTION

The inventive concept relates generally to electronic memory technologies. More particularly, the inventive concept relates to nonvolatile memory devices and related programming methods.

Electronic memory devices can be roughly divided into two categories according to whether they retain stored data when disconnected from power. These categories include volatile memory devices, which lose stored data when disconnected from power, and nonvolatile memory devices which retain stored data when disconnected from power. Examples of volatile memory devices include dynamic random access memory (DRAM) and static random access memory (SRAM), and examples of nonvolatile memory devices include flash memory, read only memory (ROM), phase change random access memory (PRAM), resistive random access memory (RRAM), and magnetoresistive random access memory (MRAM).

In recent years, there has been a continuing increase in the demand for nonvolatile memory devices. This increased demand is due in part to the proliferation of mobile devices such as mobile telephones and computing devices, which may lose power but are typically designed to store large amounts of data. Among nonvolatile memory devices, flash memory devices have become especially popular due to attractive features such as high data storage capacity, low power consumption, and resistance to physical shock.

In an effort to increase the performance and storage capacity of flash memory devices, researchers have continually reduced the feature size and spacing of flash memory devices in recent years. Moreover, researchers have also developed flash memory devices capable of storing more than one bit of data per memory cell. While these developments have enabled flash memory devices to operate at higher speeds and/or store more data, they have also tightened the operating margins of the flash memory devices, increasing potential risks of errors. Accordingly, a considerable amount of research has also been devoted to developing operating techniques for addressing these risks.

One such technique is a programming scheme referred to as incremental step pulse programming (ISPP), in which memory cells are programmed by applying an incrementally increasing program voltage to the memory cells in successive program loops to gradually increase their respective threshold voltages. In the program loops, a verification operation is performed to determine whether the memory cells have been successfully programmed to corresponding target states. After the verification operation determines that a particular memory cell has been successfully programmed to its target state, that memory cell is generally not programmed further. Unfortunately, however, the threshold voltage of the memory cell may subsequently shift due to external or internal factors such as charge leakage or coupling to adjacent components. Such a threshold voltage shift may lead to errors in stored data.

SUMMARY OF THE INVENTION

According to one embodiment of the inventive concept, a method of programming a nonvolatile memory device comprises performing a program loop comprising a programming operation that applies a first program voltage to a memory cell to program it to a target state, and a first verifying operation that determines whether a threshold voltage of the memory cell is above a target threshold voltage corresponding to the target state, and performing a soft programming operation comprising a second verifying operation that determines whether the memory cell has remained above the target threshold voltage after the memory cell has been determined to be above the target threshold voltage in a previous program loop, wherein the soft programming operation applies a second program voltage lower than the first program voltage to the memory cell to program the memory cell if the memory cell is determined not to be above below the target threshold voltage in the second verifying operation.

According to another embodiment of the inventive concept, a nonvolatile memory device comprises a controller that applies a first program voltage to a memory cell to program the memory cell, a sense latch that maintains a first state if the memory cell has not reached a target threshold voltage corresponding to a target state, and transitions to a second state if the memory cell has reached the target threshold voltage, and a state latch that is enabled if the sense latch transitions from the first state to the second state. The controller applies a second program voltage lower than the first program voltage to the memory cell to soft-program the memory cell if the sense latch is in the first state when the state latch is enabled.

These and other embodiments of the inventive concept can be used to improve the reliability of nonvolatile memory devices such as charge trap flash (CTF) devices.

BRIEF DESCRIPTION OF THE DRAWINGS

The drawings illustrate selected embodiments of the inventive concept. In the drawings, like reference numbers indicate like features.

FIG. 3 is a table illustrating a method of programming a nonvolatile memory device according to an embodiment of the inventive concept.

FIG. 10 is a table illustrating a method of programming a nonvolatile memory device according to another embodiment of the inventive concept.

DETAILED DESCRIPTION

Embodiments of the inventive concept are described below with reference to the accompanying drawings. These embodiments are presented as teaching examples and should not be construed to limit the scope of the inventive concept.

The terminology used herein is for describing particular embodiments and is not intended to limit the described embodiments. As used herein, the singular forms "a," "an," and "the," are intended to encompass the plural forms as well, unless the context clearly indicates otherwise. The terms "comprises," "comprising," "includes," and/or "including" indicate the presence of stated features, but do not preclude the presence or addition of other features. The term "and/or," includes any and all combinations of one or more of the associated listed items.

Although the terms first, second, third etc. may be used herein to describe various features, the described features should not be limited by these terms. Rather, these terms are used merely to distinguish between different features. Thus, a first feature discussed below could be termed a second feature without changing the meaning of the discussion.

Figure 1:
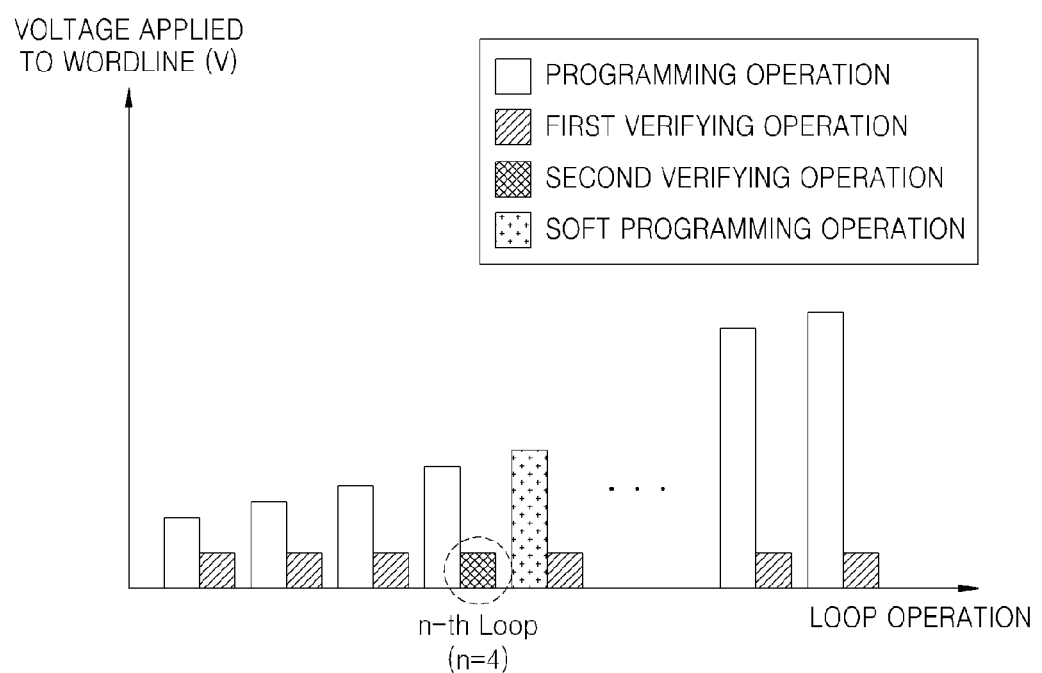
FIG. 1 is a graph illustrating a method of programming a nonvolatile memory device according to an embodiment of the inventive concept.

FIG. 1 is a graph illustrating a method of programming a nonvolatile memory device according to an embodiment of the inventive concept.

Referring to FIG. 1, the method comprises a plurality of program loops (or loop operations) each comprising a programming operation and a first verifying operation. The programming operation applies a first program voltage to a selected memory cell (or cells) to change its threshold voltage toward a target state (or states). The first program voltage is increased by a predetermined increment in successive program loops until the selected memory cell reaches the target state. Accordingly, the first program voltage can be referred to as an ISPP voltage.

The first verifying operation determines whether the selected memory cell has reached a verifying level (or threshold voltage) corresponding to the target state. The first verifying operation is performed by applying a verifying voltage to a wordline connected to the selected memory cell after the programming operation is performed.

The method of FIG. 1 further comprises a second verifying operation and a soft programming operation. The second verifying operation is performed after the selected memory cell reaches the verifying level after at least one program loop. In the second verifying operation, a verifying voltage is additionally applied to the wordline connected to the selected memory cell.

Where the second verifying operation indicates that the selected memory cell has not reached the verifying level, the soft programming operation is performed. The soft programming operation applies a second program voltage lower than the first program voltage to the selected memory cell to program the selected memory cell. In some embodiments, the soft programming operation is performed using a bitline forcing method.

In the soft programming operation using the bitline forcing method, a voltage equal to the first program voltage is applied to the wordline of the selected memory cell, and a predetermined voltage is applied to a bitline of the selected memory cell. In other words, the second program voltage that is relatively lower than the first program voltage is applied to the selected memory cell. Because a relatively lower program voltage is applied to the selected memory cell, the threshold voltage of the selected memory cell tends to increase by a relatively small amount.

The second verifying operation and the soft programming operation can be used to compensate for an initial threshold voltage shift phenomenon in which the threshold voltage shifts after the selected memory cell is programmed. The initial threshold voltage shift phenomenon may occur due to leakage of charges stored in a charge storage layer of the flash memory device (e.g., a silicon nitride layer of a charge trap flash memory device or polysilicon doped with impurities of a floating gate memory device). In particular, in a charge trap flash memory device, after the first verifying operation is performed, trapped charges can be redistributed over time, thereby reducing the threshold voltage of the selected memory cell, which causes threshold voltage distributions of memory cells to spread.

By using the second verifying operation and the soft programming operation, the method of FIG. 1 prevents a threshold voltage shift due to charge leakage after the programming-verifying operations. In particular, because the soft programming operation is performed using the second program voltage lower than the first program voltage used in the programming operation, the threshold voltage is adjusted to reduce a distribution of the threshold voltage.

Where the selected memory cell has not reached the verifying level in the second verifying operation, the above-described soft programming operation is performed with respect to the selected memory cell. However, where the selected memory cell has reached the verifying level, an inhibiting operation is performed to inhibit the selected memory cell from being programmed.

Alternatively, the second verifying operation may be performed after the program loop is performed n times (n is a natural number). In other words, it can be performed at intervals of n program loops. Therefore, the second verifying operation may be performed in an n-th program loop, and the soft programming operation using the bitline forcing method may be performed in a next program loop. The method of performing the second verifying operation and the soft programming operation will be described in further detail with reference to FIGS. 2 through 6.

Figure 2:
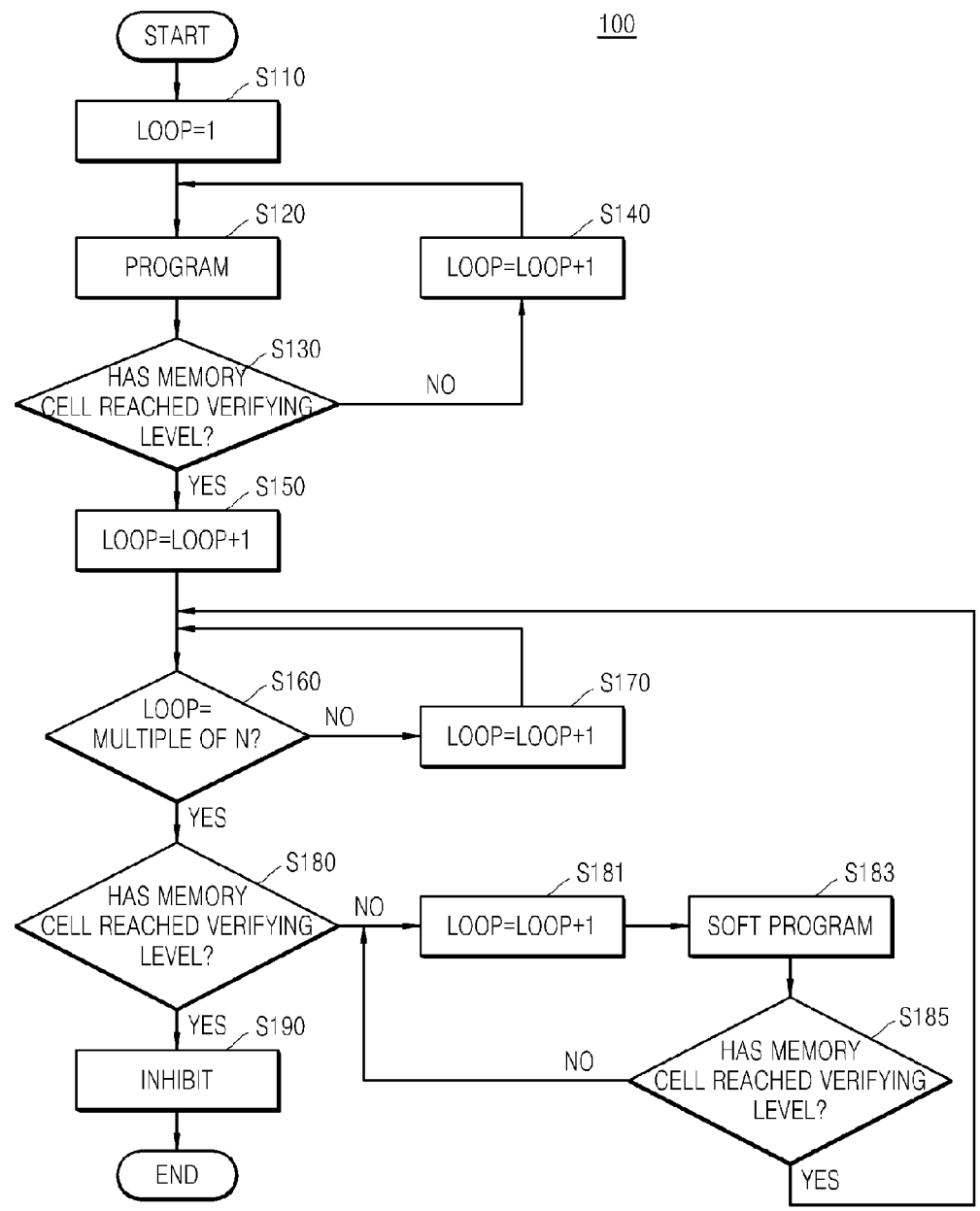
FIG. 2 is a flowchart illustrating a method of programming a nonvolatile memory device according to an embodiment of the inventive concept.

FIG. 2 is a flowchart illustrating a method 100 of programming a nonvolatile memory device according to an embodiment of the inventive concept. Method 100 can be a modification of the embodiment of FIG. 1, so descriptions of similar steps may be omitted to avoid redundancy.

Referring to FIG. 2, method 100 is performed on one memory cell. In an operation S110, a first program loop starts with respect to the memory cell. In operation S120, a programming operation is performed on the memory cell in the first program loop. In operation S130, a first verifying operation is performed to determine whether the memory cell has reached a verifying level corresponding to a target state.

Where it is determined in operation S130 that the memory cell has not reached the verifying level (S130=NO), a next program loop is performed in operation S140. Programming operation S120 and the first verifying operation S130 can also be performed in the next program loop. In particular, a first program voltage may be an ISPP voltage. In this case, a first program voltage of the next program loop may be higher by a step incremental voltage than a first program voltage of a previous program loop.

Otherwise, if it is determined in operation S130 that the memory cell has reached the verifying level (S130=YES), method 100 proceeds to a next program loop in operation S150. In operation S160 (i.e. in the next program loop), a determination is made as to whether a current program loop is an n-th program loop. If it is determined in operation S160 that the current program loop is not the n-th program loop (S160=NO), method 100 proceeds to a next program loop in operation S170. Before proceeding to the next program loop, the programming operation (or a soft programming operation) and the first verifying operation (or a second verifying operation) may be performed with respect to the other memory cells. Operations of the other memory cells will be described in more detail below with reference to FIG. 7.

As described above, the second verifying operation may be performed in an n-th program loop. Therefore, a memory cell, which has undergone the programming operation (S120) and the first verifying operation (S130) before the n-th program loop, e.g., in an (n-2)-th program loop, may not be programmed in an (n-1)-th program loop. This state may be defined as a temporary inhibition state, and an absence or a presence of the temporary inhibition state may be stored in a state latch (See, e.g., element 753 of FIG. 18).

If it is determined in operation S160 that the current program loop is the n-th program loop (S160=YES), a second verifying operation is performed to determine whether the memory cell has continuously maintained the verifying level, in operation S180.

If the memory cell maintains the verifying level in the first verifying operation (S130) but does not maintain the verifying level in the second verifying operation (S180), i.e., an initial threshold voltage shift occurs, method 100 proceeds to a next program loop in operation S181, and a soft programming operation is performed in operation S183. In operation S185, a third verifying operation is performed to determine whether the memory cell has reached the verifying level.

The soft programming operation (S183) and the third verifying operation (S185) can be repeatedly as program loops are repeated. For example, where the soft programming operation (S183) and the third verifying operation (S185) are performed with respect to the memory cell, the programming operation and the first verifying operation may be performed with respect to another memory cell.

Where the memory cell maintains the verifying level in the first verifying operation (S130) and the second verifying operation (S180), an inhibiting operation is performed in operation S190 to inhibit the memory cell from being subsequently programmed. The memory cell that has undergone the inhibiting operation (S190) can be inhibited from being programmed in a subsequent program loop. This state may be defined as an inhibition state, and an absence or a presence of the inhibition state may be stored in a data latch (See, e.g., element 757 of FIG. 18).

In method 100 of FIG. 2, if it is determined that the memory cell has not reached the verifying level in the second verifying operation (S180) performed in the n-th program loop, the soft programming operation (S183) and the third verifying operation (S185) are performed, and the second verifying operation (S180) is further performed in the 2n-th program loop. Thereafter, the memory cell that has undergone the second verifying operation (S180) is changed to the inhibition state (S190). The above method can be extended to perform the second verifying operation in other program loops that are multiples of n, e.g., 3n-th, etc.

In the method of FIG. 2, a program voltage having a high level is applied to a memory cell in a soft programming operation with an increase in an ISPP voltage, thereby increasing the memory cell's threshold voltage. A voltage applied to a bitline increases with the increase in the ISPP voltage. Because the program voltage is maintained at a constant level, the increase in the distribution is prevented by a soft programming although the number of program loops increases.

Alternatively, although the second verifying operation is performed in the n-th program loop, and thus, it is determined that the memory cell has reached the verifying level, the second verifying operation may be additionally performed in the 2n-th program loop to determine whether the memory cell has reached the verifying level. If the memory cell has maintained the verifying level, the memory cell may be changed to the inhibition state.

FIG. 3 is a table illustrating a method of programming a nonvolatile memory device, according to an embodiment of the inventive concept. FIGS. 4 through 9 are graphs illustrating shifts in threshold voltages of memory cells according to program loops that are performed in the method of FIG. 3 according to embodiments of the inventive concept. The method of FIG. 3 can be a variation of the method of FIG. 2, so descriptions of similar operations will be omitted to avoid redundancy.

The method of FIG. 3 can be performed with respect to a plurality of memory cells. In other words, program loops such as those described with reference to FIGS. 1 and 2 can be performed to program a plurality of memory cells connected to a wordline. For explanation purposes, it will be assumed that the method is performed with respect to first and second memory cells.

Referring to FIG. 3, a first program voltage is applied to first and second memory cells in a first program loop, and then a first verifying operation is performed with respect to each of the first and second memory cells.

Figure 4:
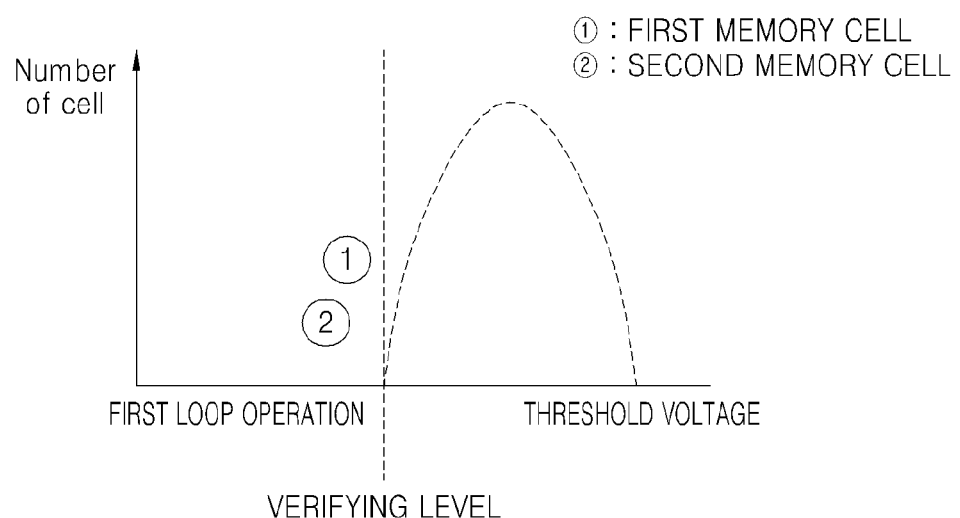
FIGS. 4 through 9 are graphs illustrating shifts in threshold voltages of memory cells due to program loops performed in the method of FIG. 3.

Referring to FIG. 4, the first and second memory cells have not reached a verifying level, and thus, a programming operation is performed with respect to both of the first and second memory cells in a next program loop.

A first program voltage is applied to the first and second memory cells in a second program loop. As described above, the first program voltage applied in the second program loop is higher by a step incremental voltage than the first program voltage applied in the first program loop. The first verifying operation is performed with respect to each of the first and second memory cells.

Figure 5:
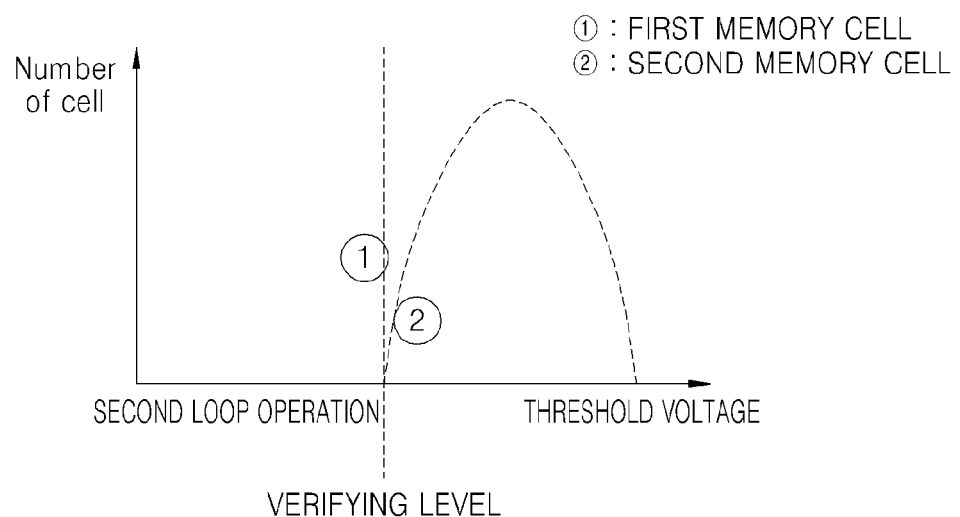

Referring to FIG. 5, according to the result of performing the first verifying operation performed in the second program loop, the first memory cell has not reached the verifying level, and thus, a programming operation is performed with respect to the first memory cell in a next program loop. On the other hand, the second memory cell has reached the verifying level, and thus, the programming operation is not performed with respect to the second memory cell in the next program loop. As described above, a state of the second memory cell may be defined as a temporary inhibition state.

A first program voltage is applied to the first memory cell in a third program loop. The programming operation is not performed with respect to the second memory cell having the temporary inhibition state in the third program loop. Where n is 3, the third program loop corresponds to an n-th program loop. In this case, the first verifying operation is performed with respect to the first memory cell, and a second verifying operation is performed with respect to a memory cell (i.e., the second memory cell) which has been programmed.

Figure 6:
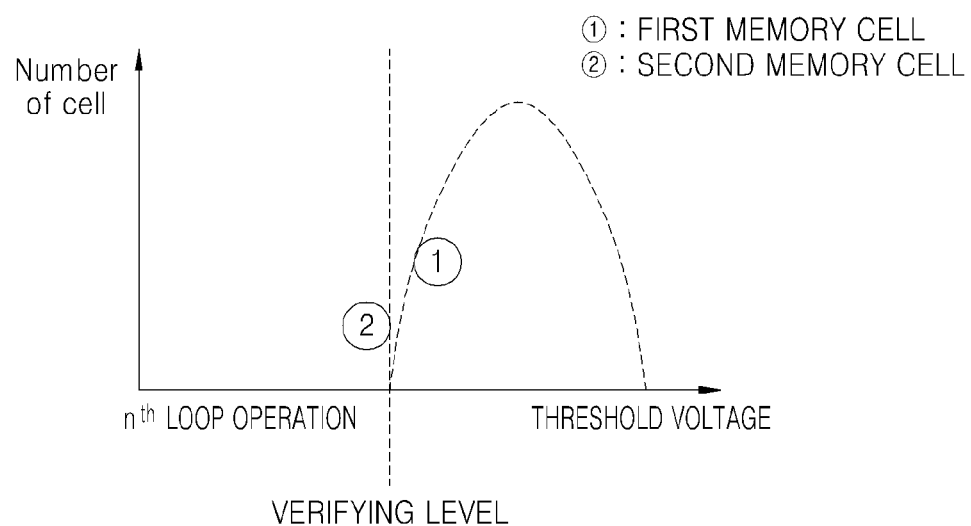

Referring to FIG. 6, according to the result of performing the first verifying operation with respect to the first memory cell in the third program loop, the first memory cell has reached the verifying level. Therefore, the first memory cell is set to a temporary inhibition state, and the programming operation is not performed in a next program loop. According to the result of performing the second verifying operation with respect to the second memory cell in the third program loop, the second memory cell has not reached the verifying level. Therefore, a soft programming operation is performed with respect to the second memory cell in a next program loop.

Figure 7:
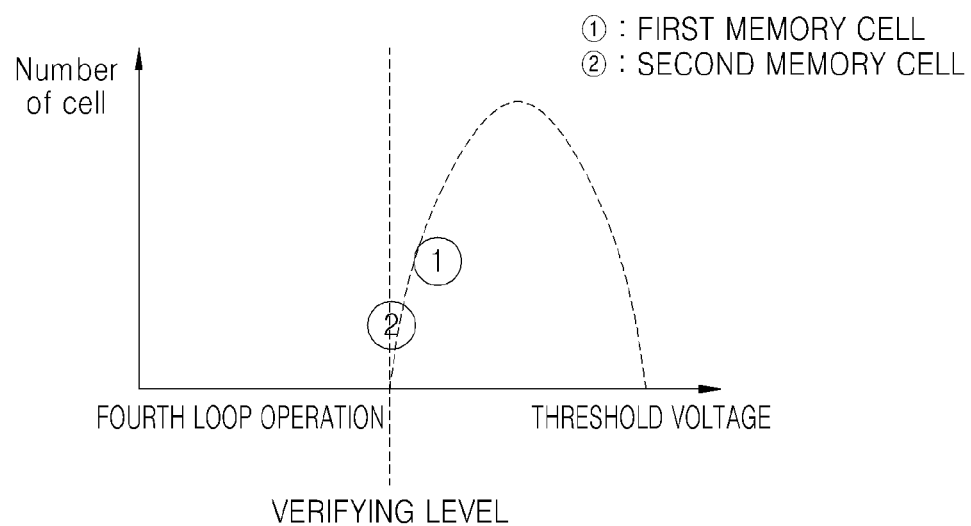

Referring to FIG. 7, the programming operation and the first verifying operation are not performed with respect to the first memory cell, which is in the temporary inhibition state, in a fourth program loop. By applying a second program voltage to the second memory cell, the soft programming operation is performed with respect to the second memory cell. A third verifying operation is performed with respect to the second memory cell. According to the result of performing the third verifying operation with respect to the second memory cells, the second memory cell has not reached the verifying level. Therefore, the soft programming operation is additionally performed with respect to the second memory cell in a next program loop.

Figure 8:
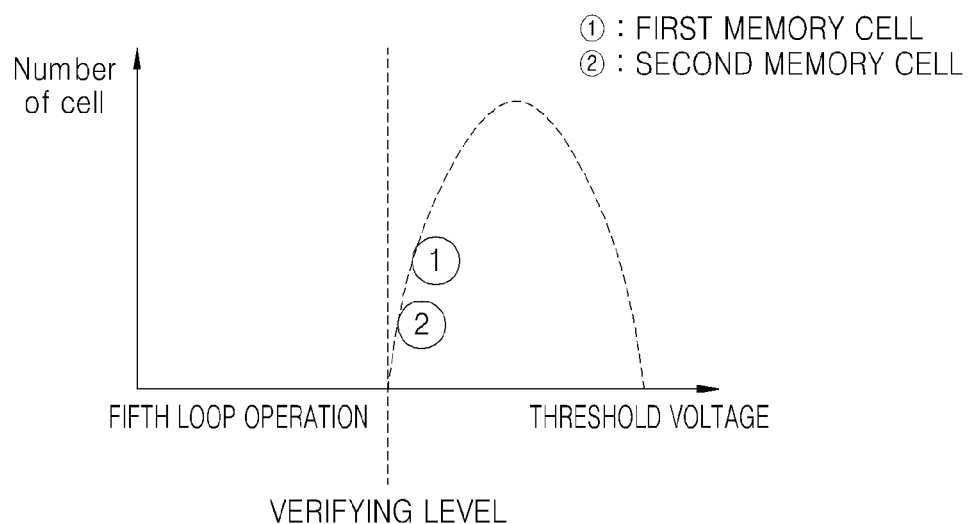

Referring to FIG. 8, the programming operation and the first verifying operation are not performed with respect to the first memory cell, which is in the temporary inhibition state, in a fifth program loop. By applying the second program voltage to the second memory cell, the soft programming operation is performed with respect to the second memory cell. The third verifying operation is performed with respect to the second memory cell. According to the result of performing the third verifying operation with respect to the second memory cell, the second memory cell has reached the verifying level. Therefore, the second memory cell is set to a temporary inhibition state, and the programming operation is not performed with respect to the second memory cell in a next program loop.

In a sixth program loop, the programming operation is not performed with respect to the first and second memory cells, which are in the temporary inhibition states. Where n is 3, the sixth program loop corresponds to an n-th program loop. Accordingly, the second verifying operation is performed with respect to memory cells (i.e., the first and second memory cells) which have been programmed.

Figure 9:
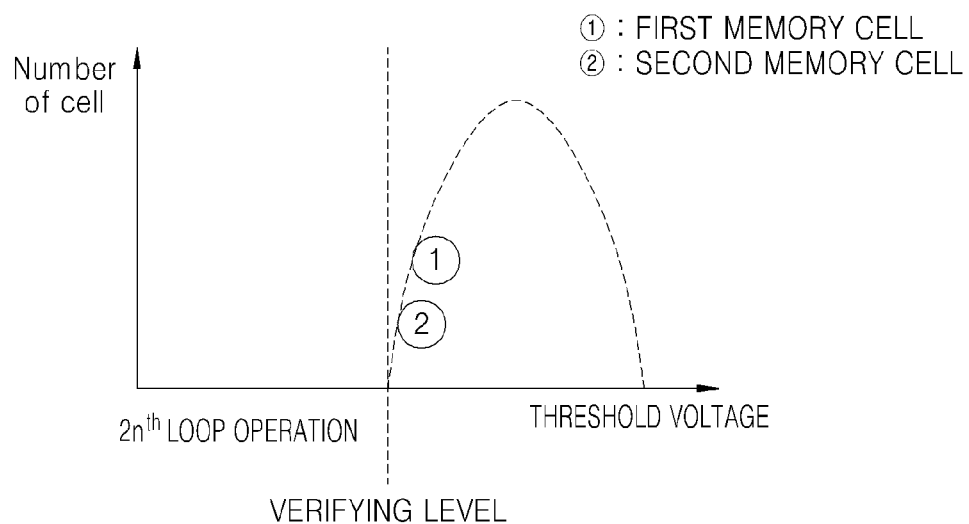

Referring to FIG. 9, according to the result of performing the second verifying operation with respect to the first and second memory cells, both the first and second memory cells have reached the verifying level. Therefore, the first and second memory cells are set to inhibition states. Although a subsequent program loop is performed with respect to memory cells which are set to inhibition states, the memory cells may not be programmed.

FIG. 10 is a table illustrating a method of programming a nonvolatile memory device according to another embodiment of the inventive concept. FIGS. 11 through 17 are graphs illustrating shifts in threshold voltages of memory cells according to program loops performed in the method of FIG. 10 according to embodiments of the inventive concept. The method of FIG. 10 is a variation of the method of FIGS. 3 through 9, so repeated descriptions of similar operations will be omitted in order to avoid redundancy.

Figure 11:
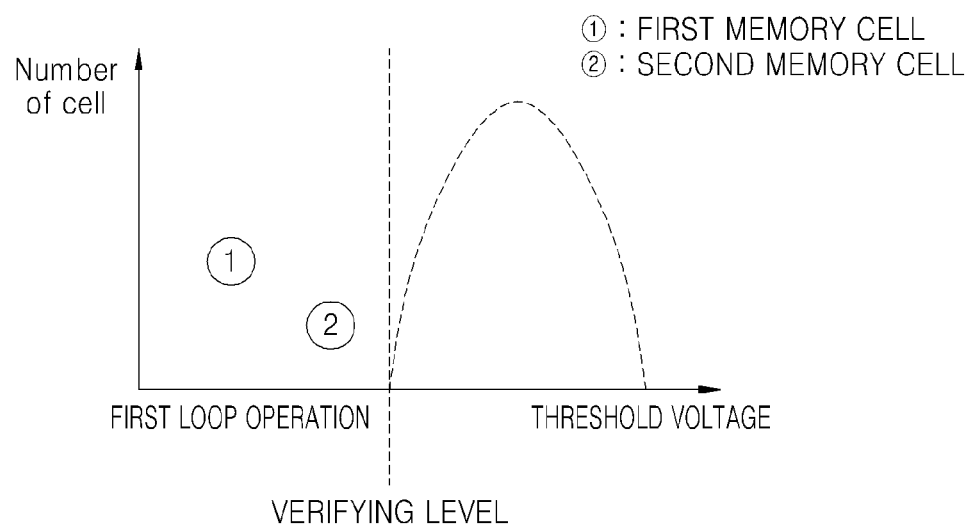
FIGS. 11 through 17 are graphs illustrating shifts in threshold voltages of memory cells due to program loops performed in the method of FIG. 10.
Figure 12:
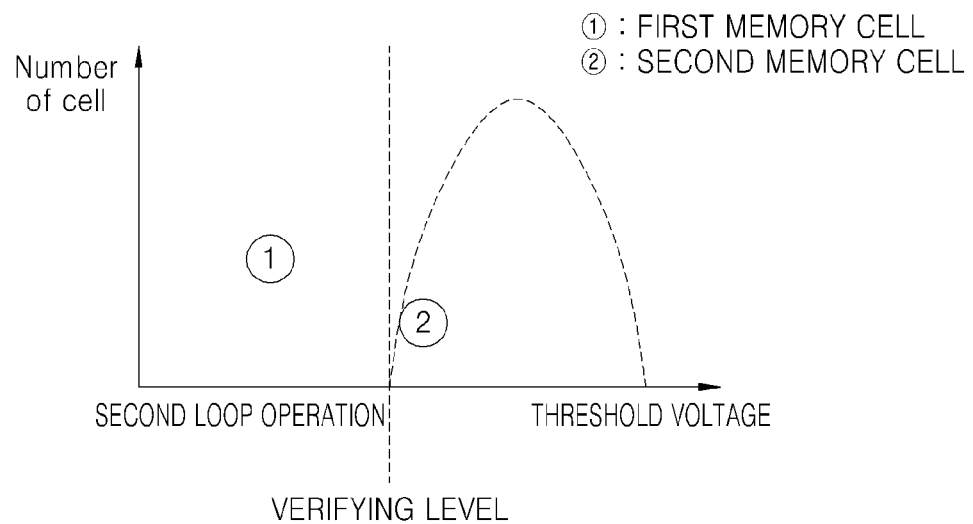

Referring to FIGS. 10 through 12, as described with reference to FIG. 3, first and second program loops are performed. Therefore, a programming operation is performed with respect to a first memory cell in a third program loop, and the programming operation is not performed with respect to a second memory cell, which is in an inhibition state, in the third program loop.

Figure 13:
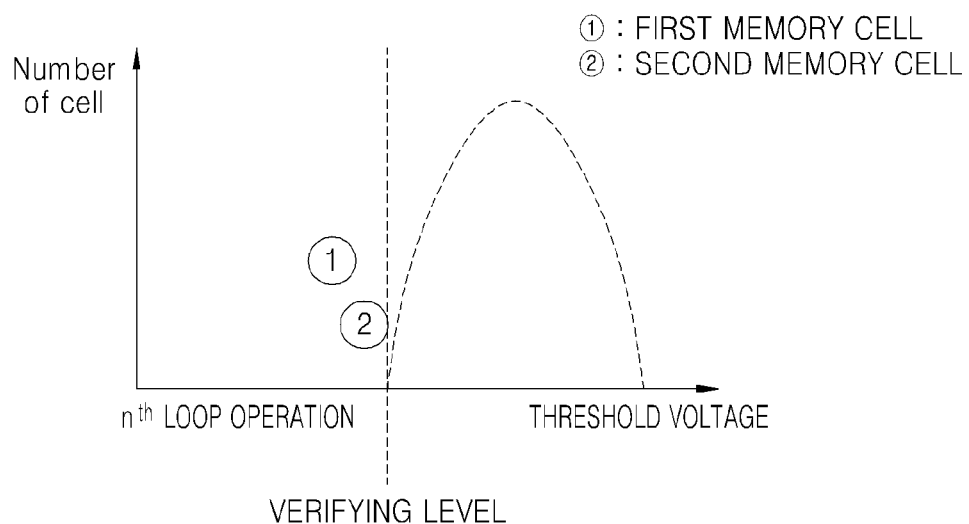

Referring to FIG. 13, according to a result of performing a first verifying operation with respect to the first memory cell in the third program loop (n=3), the first memory cell has not reached a verifying level. Therefore, the programming operation is performed with respect to the first memory cell in a next program loop. According to a result of performing a second verifying operation with respect to the second memory cell in the third program loop, the second memory cell has not reached the verifying level. Therefore, an initial threshold voltage shift occurred between the first verifying operation of the second program loop and the second verifying operation of the third program loop. As a result, a soft programming operation is performed with respect to the second memory cell in a next program loop.

In a fourth program loop, the programming operation is performed with respect to the first memory cell, and the soft programming operation is performed with respect to the second memory cell. The first verifying operation is performed with respect to the first memory cell, and a third verifying operation is performed with respect to the second memory cell.

Figure 14:
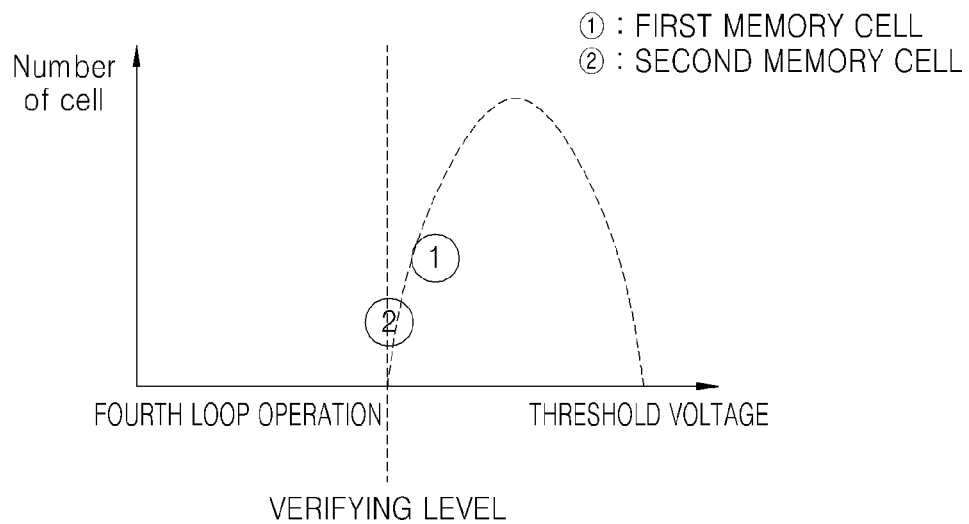

Referring to FIG. 14, according to the result of performing the first verifying operation with respect to the first memory cell in the fourth program loop, the first memory cell has reached the verifying level. Therefore, the first memory cell is set to a temporary inhibition state. According to the result of performing the third verifying operation with respect to the second memory cell, the second memory cell has not reached the verifying level. Therefore, the soft programming operation is additionally performed with respect to the second memory cell in a next program loop.

Figure 15:
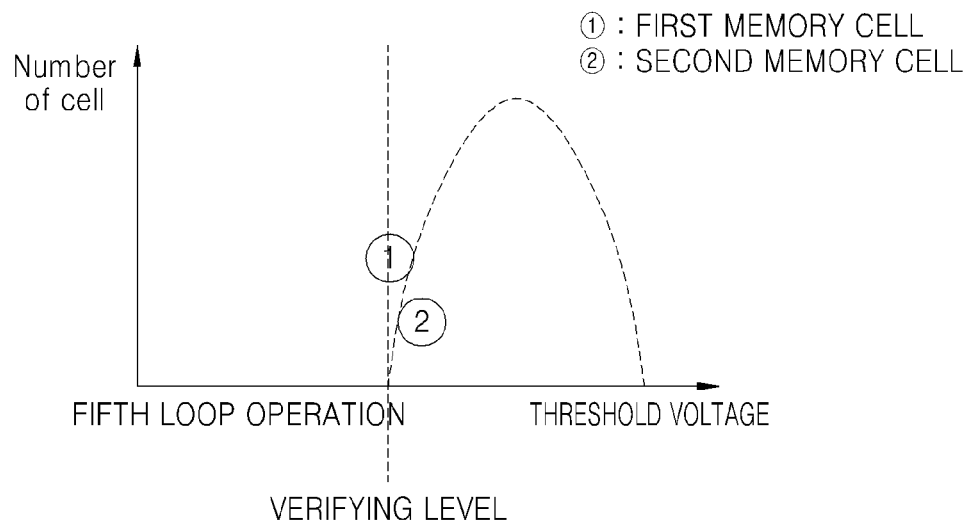

Referring to FIG. 15, the programming operation is not performed with respect to the first memory cell, which is in the temporary inhibition state, in a fifth program loop. Because the second verifying operation is performed in an n-th program loop, the second verifying operation is not performed with respect to the first memory cell although a threshold voltage shift occurs in the first memory cell, as shown in FIG. 8. As a result, the soft programming operation is not performed in a sixth program loop to correct the threshold voltage shift.

By applying a second program voltage to the second memory cell, the soft programming operation is performed with respect to the second memory cell. The third verifying operation is performed with respect to the second memory cell. According to the result of performing the third verifying operation with respect to the second memory cell, the second memory cell has reached the verifying level. Therefore, the second memory cell is set to a temporary inhibition state, and the programming operation is not performed with respect to the second memory cell in a next program loop.

In the sixth program loop, the programming operation is not performed with respect to the first and second memory cells, which are in the temporary inhibition states. Where n is 3, the sixth program loop corresponds to an n-th program loop. In this case, the second verifying operation is performed with respect to memory cells (i.e., the first and second memory cells) which are in temporary inhibition states.

Figure 16:
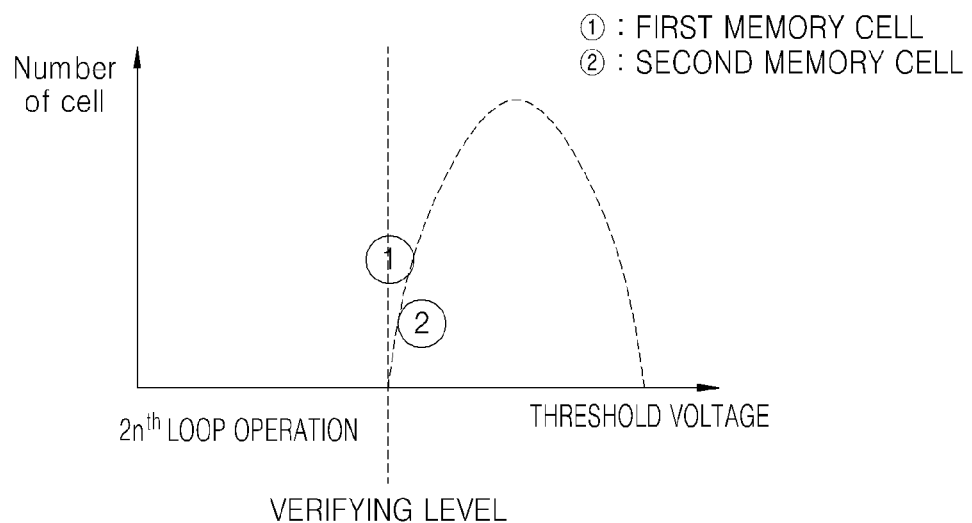

Referring to FIG. 16, according to the result of performing the second verifying operation with respect to the first and second memory cells, the second memory cell has reached the verifying level. Therefore, the second memory cell is set to an inhibition state. Then, a determination is made as to whether the first memory cell has not reached the verifying level, through the second verifying operation. Consequently, the soft programming operation is performed with respect to the first memory cell in a next program loop.

Figure 17:
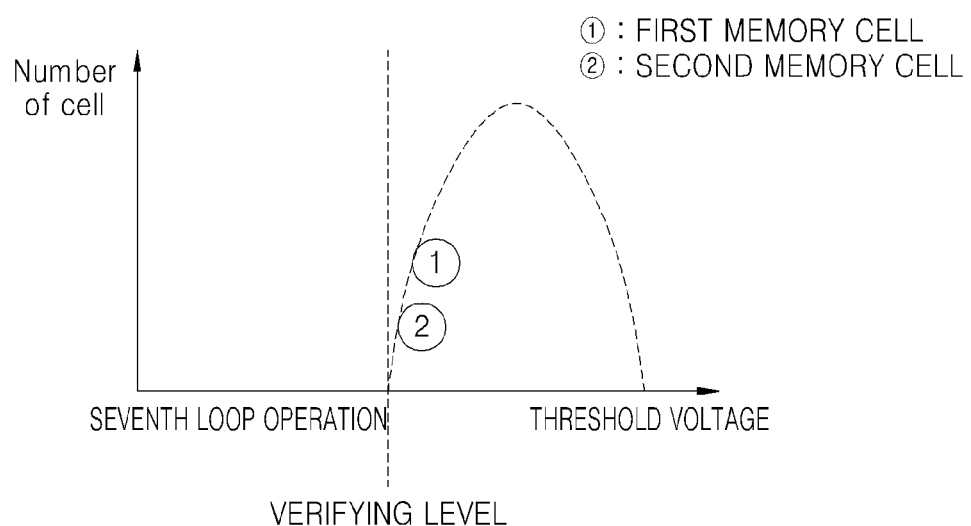

Referring to FIG. 17, the programming operation and the first verifying operation are not performed with respect to the second memory cell, which is in the inhibition state, in a seventh program loop. The soft programming operation and the third verifying operation are performed with respect to the first memory cell. According to the result of performing the third verifying operation with respect to the first memory cell, the first memory cell has reached the verifying level. Therefore, the first memory cell is set to a temporary inhibition state.

Although not shown, the temporary inhibition state is maintained to at least a ninth program loop, and the second verifying operation is performed with respect to the first memory cell in the ninth program loop. Then, a determination is made as to whether the first memory cell has been changed to an inhibition state.

As indicated by the foregoing, in an environment in which a programming operation and a first verifying operation are performed with respect to a plurality of memory cells, a soft programming operation, a second verifying operation, a third verifying operation, a temporarily inhibiting operation, and an inhibiting operation are performed in parallel with program loops. For example, as shown in the third program loop of FIG. 3, while the programming operation is performed with respect to some of the plurality of memory cells, the temporarily inhibiting operation may be performed with respect to other memory cells. Also, while the programming operation is performed with respect to some of the plurality of memory cells, the soft programming operation can be performed with respect to other memory cells. In addition, while the first verifying operation is performed with respect to some of the plurality of memory cells, the second or third verifying operation may be performed with respect to the other memory cells.

A difference between a second program voltage and a verifying level of a memory cell may be lower than a width of a distribution of a threshold voltage. This is to prevent the width of the distribution of the threshold voltage from increasing due to a process of performing a soft programming operation with respect to a memory cell in which an initial threshold voltage shift occurs due to a second verifying operation. For example, if it is determined that a threshold voltage of a memory cell has not reached a verifying level due to a second verifying operation, some of the charges leak from the memory cell due to a redistribution of the memory cell which has been programmed. Therefore, the threshold voltage of the memory cell is proximate to the verifying level.

If the difference between the second program voltage applied to the memory cell and the verifying level is higher than the width of the threshold voltage in this state, the threshold voltage of the memory cell that has undergone the soft programming operation may be set to be higher than or equal to an upper tail of the distribution of the threshold voltage. In this case, the width of the distribution of the threshold voltage increases. Accordingly, the difference between the second program voltage and the verifying level may be lower than the width of the distribution of the threshold voltage.

A period n for repeating the second verifying operation is proportional to the width of the distribution of the threshold voltage corresponding to a target state and inversely proportional to a step incremental voltage of an ISPP voltage. More specifically, the period n can be expressed by the following equation (1).

$$\text{Period} = \frac{\text{Width of Distribution of Threshold Voltage(V)}}{\text{Step Incremetnal Voltage of } ISPP \text{ Voltage(V)}} \quad (1)$$

The second verifying operation indicates that the soft programming operation is performed with respect to the memory cell in which the under tail has occurred. If a soft programming operation using a bitline forcing method is performed, a voltage obtained by subtracting a voltage applied to a bitline from an ISPP voltage applied to a wordline of the memory cell may be defined as a second program voltage.

In this case, the ISPP voltage increases by a step incremental voltage with an increase in the number of program loops, but the voltage applied to the bitline is constant. This indicates that the second program voltage increases as the number of program loops is increased.

Where the second program voltage increases with the increase in the number of program loops, the second verifying operation and the soft programming operation may be performed at a period of an n-th program loop to prevent the distribution of the threshold voltage from increasing.

For example, if the period is very long, the soft programming operation may be performed after a larger number of program loops to correct an initial threshold voltage shift. Because the second programming operation has greatly increased in this case, a threshold voltage of a memory cell, which has undergone the soft programming voltage, may be set to be higher than or equal to an upper tail of a distribution of the threshold voltage, thereby increasing a width of the distribution of the threshold voltage.

In the above method, as long as a condition is satisfied whereby a number obtained by multiplying a step incremental voltage of an ISPP voltage and a period together is lower than the width of the distribution of the threshold voltage, the width of the distribution may be prevented from increasing. Also, an appropriate n value of the period may be determined according to equation (1) above to satisfy the above condition.

Figure 18:
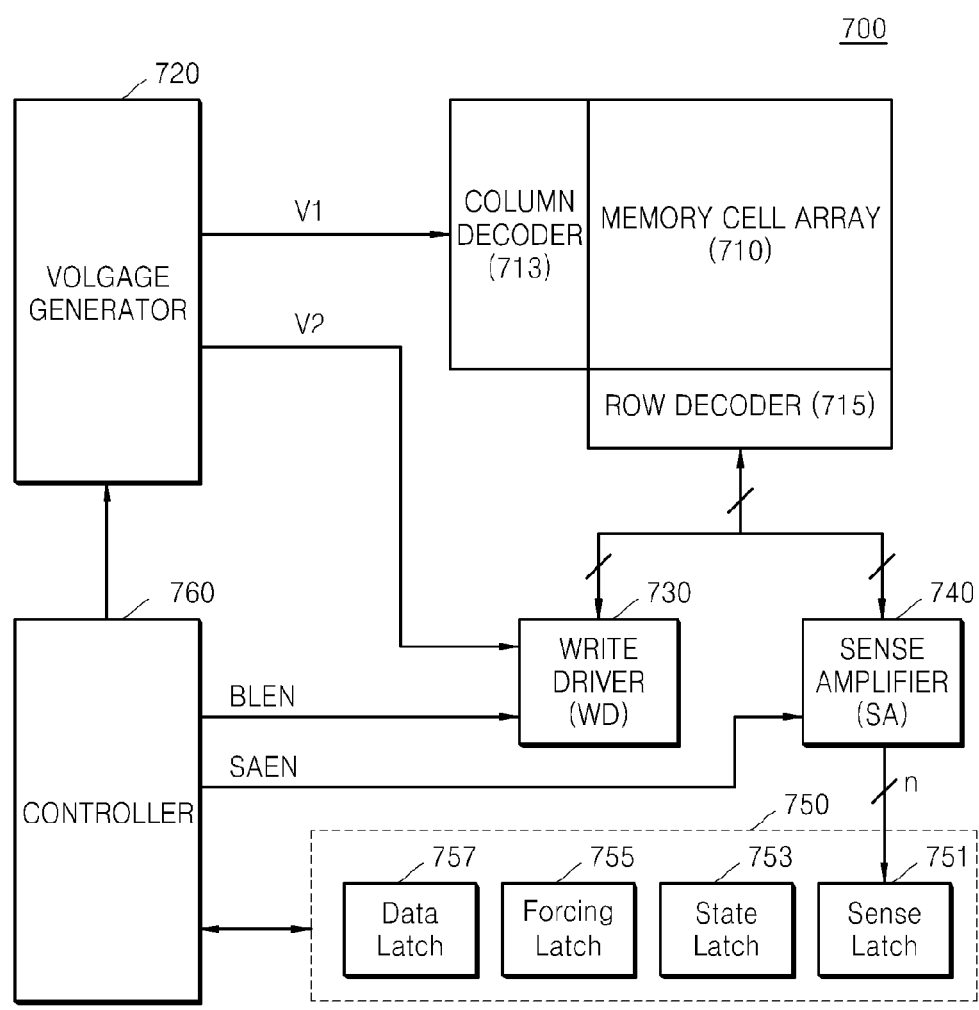
FIG. 18 is a block diagram of a nonvolatile memory device according to an embodiment of the inventive concept.

FIG. 18 is a block diagram of a nonvolatile memory device 700 according to an embodiment of the inventive concept. Nonvolatile memory device 700 can be used to perform methods such as those described above.

Referring to FIG. 18, nonvolatile memory device 700 comprises a memory cell array 710 having a column decoder 713 and a row selector 715, a voltage generator 720, a write driver 730, a sense amplifier 740, a detector 750, and a controller 760.

Memory cell array 710 can be a flash memory cell array, in particular, may be an NAND type memory cell array. Memory cell array 710 comprises column decoder 713 and row selector 715 for selecting memory cells.

Voltage generator 720 generates voltages V1 and V2, which are used when a programming operation and a verifying operation are performed, and provides voltages V1 and V2 to a wordline of memory cell array 710 and write driver 730, respectively. Voltage V1 provided to the wordline comprises a voltage provided when a memory cell is programmed and a voltage provided when the verifying operation is performed. As described above, the voltage provided to the wordline when the programming operation is performed may be a pulse voltage that complies with the ISSP voltage or an ISPP scheme.

Write driver 730 sets a bitline voltage of memory cells, which are to be programmed, in the programming operation. In the programming operation, voltage V2 provided from voltage generator 720 may be transmitted to the bitline of the memory cell in response to a bitline enable signal BLEN, which is input from controller 760.

In the programming operation, the pulse voltage applied to the wordline of the memory cell based on voltage V1 synchronizes with the bitline voltage applied to the bitline of the memory cell based on voltage V2. Also, a program voltage applied to the memory cell may be determined according to the pulse voltage applied to the wordline and the bitline voltage.

Sense amplifier 740 is connected to the bitline of the memory cell to sense a state of the memory cell in the verifying operation (or a reading operation). For example, in a verifying operation of a program loop, a verifying voltage is applied to the wordline of the memory cell. Also, sense amplifier 740 senses whether a threshold voltage of the memory cell has reached a verifying level, in response to a sense enable signal SAEN.

Detector 750 is a circuit that detects the sensing result of sense amplifier 740 and outputs next operation signal information. More specifically, detector 750 stores state information of memory cells that have been changed through the programming operation and the verifying operation, generates next operation signal information based on the state information of the memory cells, and transmits the next operation signal information to controller 760.

Controller 760 controls operations of the above-described structures during the programming operation and the verifying operation. For example, controller 760 applies a first or second program voltage to the memory cell in the programming operation to program and/or soft-program the memory cell. For example, in the programming operation, controller 760 controls voltage generator 720 to provide the pulse voltage to the wordline of memory cell array 710. For example, in the soft programming operation, controller 760 controls write driver 730 to provide a predetermined voltage to the bitline of memory cell array 710 according to a bitline forcing method.

A structure and an operation of detector 750 will now be described in more detail. Detector 750 comprises a sense latch 751, a state latch 753, a forcing latch 755, and a data latch 757. Sense latch 751 is connected to sense amplifier 740 to store the state of the memory cell, i.e., to store whether the memory cell has reached a verifying level corresponding to a target state. For example, if the memory cell has not reached the verifying level, sense latch 751 maintains a first state. Otherwise, if the memory cell has reached the verifying level, sense latch 751 transitions to a second state.

State latch 753 is enabled in response to the transition of sense latch 751. The transition of sense latch 751 (i.e., a transition from the first state to the second state) indicates that the memory cell is in a temporary inhibition state. Therefore, state latch 753 is enabled to store a state corresponding to the temporary inhibition state.

Data stored in sense latch 751 and state latch 753 of detector 750 is transmitted to controller 760, and controller 760 determines a next operation, which will be performed with respect to the memory cell in a next program loop, based on the data. For example, if sense latch 751 is in the first state when state latch 753 is disabled, controller 760 performs a programming operation with respect to a corresponding memory cell in a next program loop. Also, if sense latch 751 is in the second state when state latch 753 is disabled, controller 760 determines that the memory cell is in a temporary inhibition state and the memory cell is inhibited from being programmed in the next program loop.

If sense latch 751 is in the first state when state latch 753 is enabled, it is determined that an initial threshold voltage shift occurred. Therefore, controller 760 applies a second program voltage lower than a first program voltage to perform a soft programming operation with respect to the memory cell.

Accordingly, controller 760 controls an operation performed in the next program loop based on the data received from detector 750. A determination is made as to whether a next operation of controller 760 is to be performed, according to a set state or a reset state of data latch 757.

Data latch 757 stores data for programming the memory cell in a form of the reset state or the set state. If data latch 757 is in the reset state, controller 760 performs the programming operation or the soft programming operation. If data latch 757 is in the set state, controller 760 does not perform the programming operation or the soft programming operation. In other words, the set state of data latch 757 corresponds to an inhibition state of the memory cell.

Forcing latch 755 is a latch that defines the soft programming operation performed in the next program loop. In other words, if forcing latch 755 is in a high state, the soft programming operation is performed in the next program loop. For example, in a bitline forcing method, if forcing latch 755 is in the high state, a predetermined voltage is applied to the bitline of the memory cell to apply the second program voltage lower than the first program voltage.

In the programming operation of the program loop, the memory cell may be programmed, soft-programmed, or inhibited and thus may not be programmed. An operation of the memory cell is determined based on the data stored in detector 750, and a truth table for the operation of detector 750 is shown in Table 1 below.

TABLE 1

| Data Latch (757) | Forcing Latch (755) | State Latch (753) | Operation Performed in Programming Operation |
|---|---|---|---|
| Reset (0) | Low (0) | Disable (0) | Programming |
| Reset (0) | Low (0) | Enable (1) | Inhibiting (Temporarily) |
| Reset (0) | High (1) | Enable (1) | Soft Programming |
| Set (1) | Low (0) | Disable (0) | Inhibiting |

In the verifying operation of the program loop, the next operation to be performed with respect to the memory cell is determined based on the data stored in detector 750. Accordingly, data of detector 750 changes to another state based on the data stored in detector 750, and a truth table of this is shown in Table 2 below. For convenience, a reset state, a low state, and a disable state are indicated by "0," and a set state, a high state, and an enable state are indicated by "1."

TABLE 2

| Sense Latch | Data Latch | Forcing Latch | State Latch | Next Operation | Next Data Latch | Next Forcing Latch | Next State Latch |
|---|---|---|---|---|---|---|---|
| 1 | 0 | 0 | 0 | Programming | 0 | 0 | 0 |
| 0 | 0 | 0 | 0 | Inhibiting (Temporarily) | 0 | 0 | 1 |
| 1 | 0 | 0 | 1 | Soft Programming | 0 | 1 | 1 |
| 0 | 0 | 0 | 1 | Inhibiting | 1 | 0 | 0 |
| 1 | 0 | 1 | 1 | Soft Programming | 0 | 1 | 1 |
| 0 | 0 | 1 | 1 | Inhibiting | 1 | 0 | 0 |

Referring to Table 2, if sense latch 751 maintains the second state (0) when state latch 753 is in an enable state (1), data latch 757 transitions to the set state (1). Transition patterns of the above latches may be expected using this method.

FIGS. 19 through 22 are views illustrating data in detector 750 that transitions as the first through fourth program loops are performed with respect to the second memory cell in the embodiment of FIG. 3 based on information shown in Tables 1 and 2.

Pairs of latches of detector 750 will be expressed with 3-dimensional (3D) coordinates. In other words, the pairs of latches of detector 750 will be expressed in forms such as a state of data latch 757, a state of forcing latch 755, and a state of state latch 753.

Figure 19:
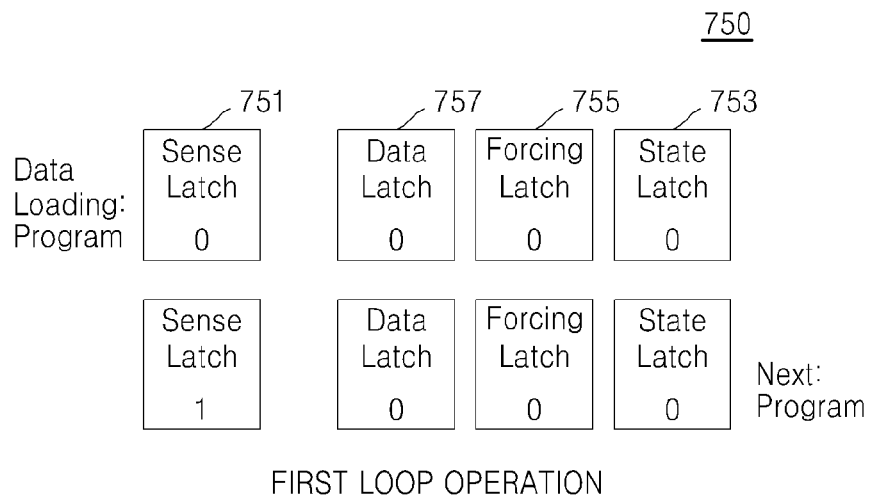
FIGS. 19 through 22 are conceptual diagrams illustrating data transitions of data stored in a detector of a nonvolatile memory device in a method of programming a nonvolatile memory device according to another embodiment of the inventive concept.

Referring to FIG. 19, in a first program loop, latches of detector 750 are 0, 0, and 0, so a programming operation is performed with respect to the second memory cell. In a first verifying operation, according to the sensing result of sense amplifier 740, sense latch 751 maintains the first state (1), so the second memory cell is determined as an ON cell. Consequently, the latches of detector 750 are determined as 0, 0, and 0 to re-program the second memory cell.

Figure 20:
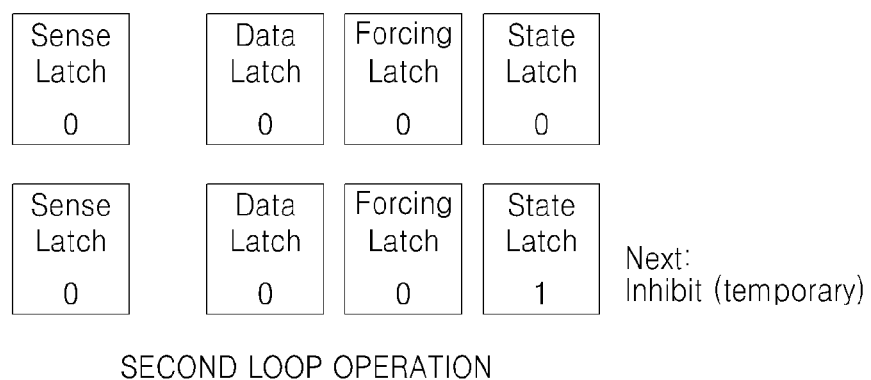

Referring to FIG. 20, in a second program loop, the latches of detector 750 are 0, 0, and 0, so the programming operation is performed with respect to the second memory cell. In the first verifying operation, according to the sensing result of sense amplifier 740, sense latch 751 transitions to the second state (0), so the second memory cell is determined as an OFF cell. Therefore, the latches of detector 750 are determined as 0, 0, and 1 not to program the second memory cell.

Figure 21:
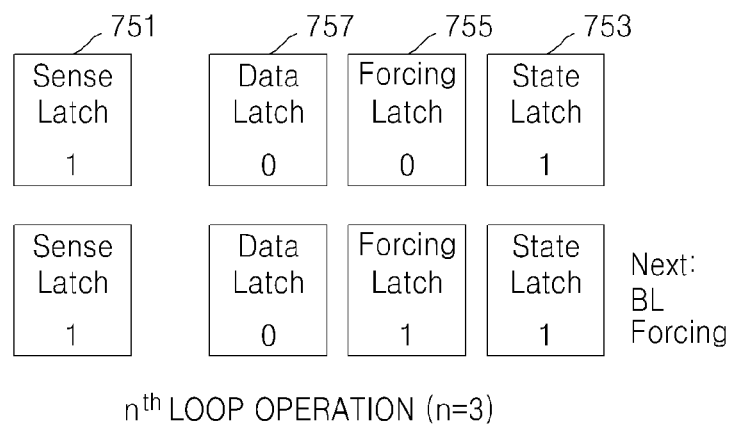

Referring to FIG. 21, in a third program loop, the latches of detector 750 are 0, 0, and 1, so the second memory cell is in a temporary inhibition state. Consequently, the programming operation is not performed with respect to the second memory cell. In the first verifying operation, according to the sensing result of sense amplifier 740, sense latch 751 transitions to the first state (1), so the second memory cell is determined as an ON cell. Consequently, the latches of detector 750 are determined as 0, 1, and 1, to soft-program the second memory cell.

Figure 22:
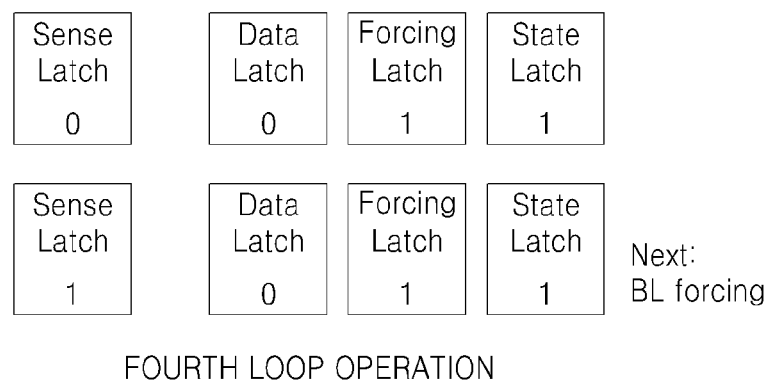

Referring to FIG. 22, in a fourth program loop, the latches of detector 750 are 0, 1, and 1, so a soft programming operation is performed with respect to the second memory cell. In the first verifying operation, according to the sensing result of sense amplifier 740, sense latch 751 maintains the first state (1), so the second memory cell is determined as an ON cell. Consequently, the latches of detector 750 are determined as 0, 1, and 1 to soft-program the second memory cell.

As described above, program loops are repeated, and the latches of detector 750 are changed to perform a programming method on nonvolatile memory device 700 according to an embodiment of the inventive concept.

Figure 23:
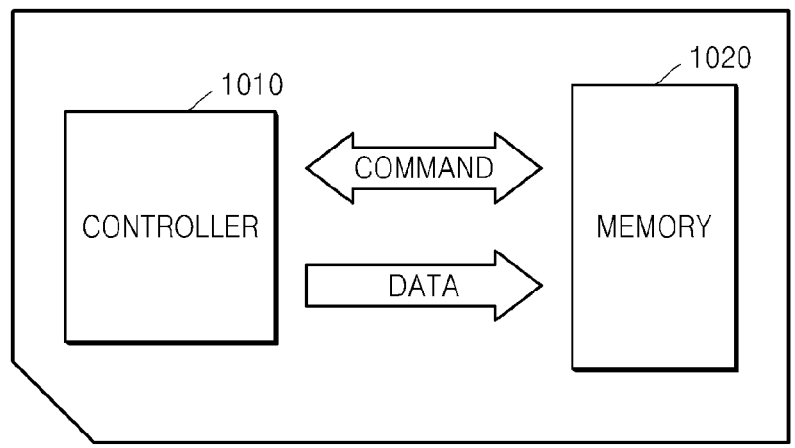
FIG. 23 is a diagram of a memory card incorporating a nonvolatile memory device according to an embodiment of the inventive concept.

FIG. 23 is a diagram of a memory card 1000 incorporating a nonvolatile memory device according to embodiments of the inventive concept.

Referring to FIG. 23, memory card 1000 comprises a controller 1010 and a memory 1020 configured to exchange electric signals with each other. For example, where controller 1010 transmits a command to memory 1020, memory 102 transmits data. Memory 1020 comprises one or more nonvolatile memory devices such as those described above in relation to various embodiments of the inventive concept.

The nonvolatile memory devices can be formed in NAND and NOR memory arrays, and these memory arrays can form one or more memory array banks. Memory 1020 typically comprises such memory arrays (not shown) or memory array banks (not shown). Memory card 1000 typically further comprises a column decoder (not shown), a row decoder (not shown), an input/output (I/O) buffer (not shown), and/or a control register (not shown) to drive the above-described memory array banks. Memory card 1000 can take any of various alternative forms, such as a memory stick card, a smart media (SM) card, a secure digital (SD) card, a mini secure digital (mini SD) card, a multimedia card (MMC), etc.

Figure 24:
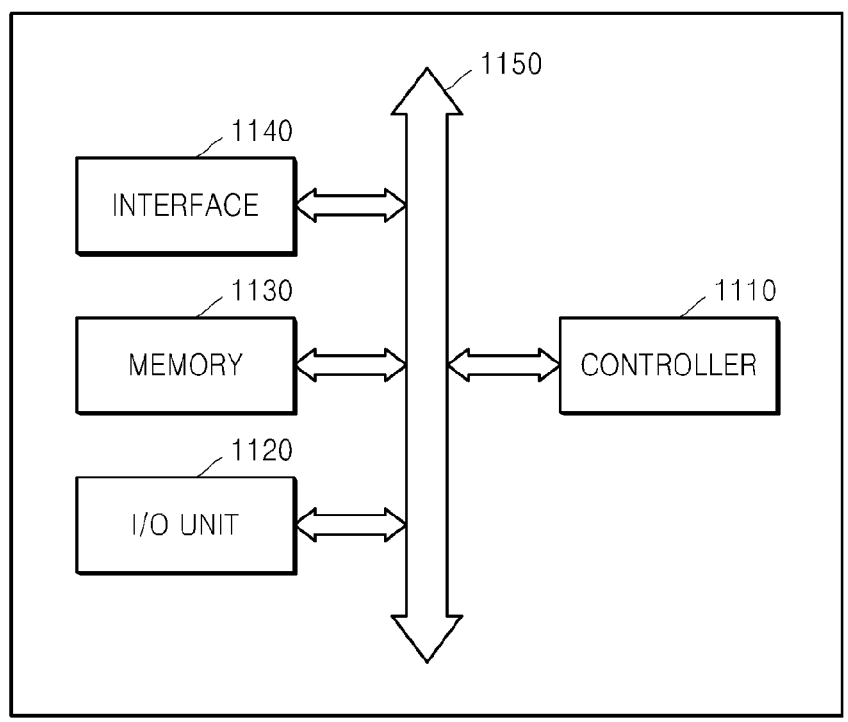
FIG. 24 is a diagram of a system incorporating a nonvolatile memory device according to an embodiment of the inventive concept.

FIG. 24 is a block diagram of a system 1100 incorporating a nonvolatile memory device according to an embodiment of the inventive concept.

Referring to FIG. 24, system 1100 comprises a controller 1110, an I/O unit 1120, a memory 1130, and an interface 1140. System 1100 can be a mobile system or a system that transmits or receives information. The mobile system can be, for instance, a personal digital assistant (PDA), a portable computer, a web tablet, a wireless phone, a mobile phone, a digital music player, or a memory card. Controller 1110 executes a program and controls system 1100. Controller 1110 may be a microprocessor, a digital signal processor, a microcontroller, or a device similar to them. I/O unit 1120 is used to input or output data of system 1100.

System 1100 is connected to an external device (not shown), e.g., a personal computer (PC) or a network, through I/O unit 1120 to exchange data with the external device. I/O unit 1120 may be a keypad, a keyboard, or a display. Memory 1130 stores code and/or data for an operation of controller 1110 and/or data processed by controller 1110. Memory 1130 can comprise nonvolatile memory devices according to one of the embodiments of the inventive concept. Interface 1140 may be a data transmission path between system 1100 and the external device. Controller 1110, I/O unit 1120, memory 1130, and interface 1140 communicate with one another through a bus 1150. For example, system 1100 can be applied to a mobile phone, an MP3 player, a navigation device, a portable multimedia player (PMP), a solid state disk (SSD), or a household appliance.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a nonvolatile memory device, comprising:

performing a program loop comprising a programming operation that applies a first program voltage to a memory cell to program it to a target state, and a first verifying operation that determines whether a threshold voltage of the memory cell is above a target threshold voltage corresponding to the target state; and performing a soft programming operation comprising a second verifying operation that determines whether the memory cell has remained above the target threshold voltage after the memory cell has been determined to be above the target threshold voltage in a previous program loop, wherein the soft programming operation applies a second program voltage lower than the first program voltage to the memory cell to program the memory cell if the memory cell is determined not to be above below the target threshold voltage in the second verifying operation.

2. The method of claim 1, wherein the nonvolatile memory device is a charge trap flash (CTF) memory device.

3. The method of claim 1, further comprising:

if the memory cell has reached the target threshold voltage in the second verifying operation, performing an inhibiting operation to inhibit the memory cell from being programmed.

4. The method of claim 3, wherein the program loop is performed to program a plurality of memory cells connected to a wordline, and wherein when the programming operation is performed with respect to some of the plurality of memory cells, and the inhibiting operation is performed with respect to remaining memory cells among the plurality of memory cells.

5. The method of claim 1, wherein the program loop is performed to program a plurality of memory cells connected to a wordline.

6. The method of claim 5, wherein when the program loop is performed with respect to some of the plurality of memory cells, and one of the second verifying operation and the soft programming operation is performed with respect to other memory cells among the plurality of memory cells.

7. The method of claim 6, wherein when the first verifying operation is performed with respect to some of the plurality of memory cells, the second verifying operation is performed with respect to other memory cells among the plurality of memory cells.

8. The method of claim 6, wherein when the programming operation is performed with respect to some of the plurality of memory cells, and the soft programming operation is performed with respect to other memory cells among the plurality of memory cells.

9. The method of claim 1, wherein the soft programming operation shifts the threshold voltage of the memory cell by an amount less than a width of a distribution of threshold voltage distribution corresponding to the target state.

10. The method of claim 1, wherein the second verifying operation is performed periodically in every n-th program loop, where n is a natural number greater than one.

11. The method of claim 10, wherein if it is determined that the memory cell has not reached the target threshold voltage, in the second verifying operation which is performed in an n-th program loop, the second verifying operation is additionally performed in a 2n-th program loop to further determine whether the memory cell has reached the verifying level.

12. The method of claim 10, wherein n is proportional to a width of a threshold voltage distribution corresponding to the target state.

13. The method of claim 10, wherein n is inversely proportional to a step incremental voltage of an incremental step pulse program (ISPP) voltage.

14. The method of claim 10, wherein n is proportional to a width of a threshold voltage distribution corresponding to the target state and inversely proportional to a step incremental voltage of an incremental step pulse program (ISPP) voltage.

15. A nonvolatile memory device comprising:
a controller that applies a first program voltage to a memory cell to program the memory cell;
a sense latch that maintains a first state if the memory cell has not reached a target threshold voltage corresponding to a target state, and transitions to a second state if the memory cell has reached the target threshold voltage; and
a state latch that is enabled if the sense latch transitions from the first state to the second state,
wherein the controller applies a second program voltage lower than the first program voltage to the memory cell to soft-program the memory cell if the sense latch is in the first state when the state latch is enabled.

16. The nonvolatile memory device of claim 15, wherein the second state corresponds to a temporary inhibition state indicating that the memory cell is to be inhibited from being programmed during at least one subsequent program loop.

17. The nonvolatile memory device of claim 16, wherein the temporary inhibition state is applied to the memory cell for a period determined by a width of a threshold voltage distribution corresponding to the target state.

18. The nonvolatile memory device of claim 15, wherein the nonvolatile memory device is a charge trap flash (CTF) memory device.

19. The nonvolatile memory device of claim 15, wherein the controller determines whether the sense latch is in the first or second state, and upon determining that the sense latch is in the second state, inhibits programming of the memory cell, and otherwise allows programming of the memory cell.

20. The nonvolatile memory device of claim 15, further comprising a data latch and a forcing latch, wherein a combination of states of the data latch, the forcing latch, and the sensing latch determine whether the memory cell is programmed, inhibited from being programmed, or soft programmed, in at least one program loop.

* * * * *